United States Patent
Volke et al.

(10) Patent No.: US 9,606,278 B2
(45) Date of Patent: Mar. 28, 2017

(54) STRUCTURED POLARIZER AND METHOD FOR MANUFACTURING THE SAME

(71) Applicant: CODIXX AG, Barleben (DE)

(72) Inventors: André Volke, Zerbst (DE); Andrei Stalmashonak, Magdeburg (DE)

(73) Assignee: Codixx AG, Barleben (DE)

( * ) Notice: Subject to any disclaimer, the term of this patent is extended or adjusted under 35 U.S.C. 154(b) by 0 days.

(21) Appl. No.: 14/845,003

(22) Filed: Sep. 3, 2015

(65) Prior Publication Data
US 2016/0070043 A1 Mar. 10, 2016

(30) Foreign Application Priority Data

Sep. 4, 2014 (EP) .................................. 14183595

(51) Int. Cl.
*G02B 5/30* (2006.01)
*B29D 11/00* (2006.01)
*C03C 14/00* (2006.01)
*C03C 23/00* (2006.01)
*G01J 3/02* (2006.01)
(Continued)

(52) U.S. Cl.
CPC ...... *G02B 5/3008* (2013.01); *B29D 11/00644* (2013.01); *C03C 14/006* (2013.01); *C03C 17/09* (2013.01); *C03C 23/007* (2013.01); *C03C 23/0025* (2013.01); *G01J 3/0224* (2013.01); *G02B 5/3058* (2013.01); *G02B 27/286* (2013.01); *G03F 7/70* (2013.01);
(Continued)

(58) Field of Classification Search
CPC ...... G02B 5/30; G02B 5/3025; G02B 5/3033; G02B 5/3058; G02B 27/28; G02B 27/286

USPC ........... 359/483.01, 486.01, 486.02, 487.01, 359/487.02, 487.03, 487.05, 487.06; 362/19; 353/20
See application file for complete search history.

(56) References Cited

U.S. PATENT DOCUMENTS

| 7,256,937 | B2  | 8/2007  | Volke et al. |
| 2003/0227669 | A1* | 12/2003 | Volke ................. G02B 5/3033 359/352 |
| 2004/0095644 | A1* | 5/2004  | Berger ................ G02B 5/3058 359/487.06 |

FOREIGN PATENT DOCUMENTS

| DE | 198 23 257 A1 | 2/2000 |
| DE | 100 64 456 A1 | 7/2002 |

OTHER PUBLICATIONS

Corresponding European Search Report for Application No. 14183595.9, dated Feb. 16, 2015, 6 pages.

* cited by examiner

*Primary Examiner* — Arnel C Lavarias
(74) *Attorney, Agent, or Firm* — Lewis Roca Rothgerber Christie LLP

(57) ABSTRACT

A structured polarizer includes a substrate including a dielectric material including elongated metal particles embedded to form a polarizing layer including a plurality of first polarizing regions having first elongated metal particles collectively aligned along a first direction and a plurality of second regions having second metal particles, the first polarizing regions and the second regions adjoining each other, the first metal particles being in the same plane as the second metal particles, a degree of polarization with respect to the first direction in the first polarizing regions at between 0.5 μm and 1 μm from a boundary between the first polarizing regions and the second regions being more than 90%, and a degree of polarization with respect to the first
(Continued)

direction in the second regions at between 0.5 μm and 1 μm from the boundary between the first polarizing regions and the second regions being less than 10%.

17 Claims, 6 Drawing Sheets

(51) Int. Cl.
    *G02B 27/28*     (2006.01)
    *C03C 17/09*     (2006.01)
    *G03F 7/20*     (2006.01)

(52) U.S. Cl.
    CPC .... *C03C 2214/08* (2013.01); *C03C 2217/252* (2013.01); *C03C 2218/33* (2013.01); *C03C 2218/34* (2013.01)

STRUCTURED POLARIZER AND METHOD FOR MANUFACTURING THE SAME

CROSS-REFERENCE TO RELATED APPLICATION

This application claims priority to European Patent Application No. 14183595.9 filed on Sep. 4, 2014, the entire contents of which are herein incorporated by reference.

BACKGROUND OF THE INVENTION

Structured polarizers are used in many applications such as imaging polarimetry or interferometry. Due to the higher resolution of the image sensors, there is a high demand to have structured polarizers with a high spatial resolution in terms of portions with different polarization direction. Furthermore there is a high demand that the optically active layer of such polarizers is thin and provides a high polarization contrast.

One approach to obtain a structured polarizer with desired characteristics is the application of a wire grid onto an optically transparent material. The maximum resolution is however limited with this approach. Furthermore, the manufacturing costs are rather high. Also, the surface is very sensitive to mechanical contact or impact.

Another approach to obtain a structured polarizer with desired characteristics is the embodiment of metallic nanoparticles into an optically transparent substrate, whereby the nanoparticles such as silver are introduced in vicinity of the surface of the substrate e.g. as spherical colloids. In order to obtain a spatially structured polarizer, the spherical particles are then treated e.g. by heating and mechanical stretching or laser irradiation. Said treatment elongates and aligns the particles along a common direction which then exhibits polarization characteristics.

U.S. Pat. No. 7,256,937 B2 discloses a spatially structured polarizing device in which a plurality of superimposed structured polarizing substrates is used, each of the substrates having one common polarization direction over the whole substrate, the polarization direction of the substrates being different to each other, wherein each of the substrates can be structured by removing an upper portion of the substrate e.g. by etching a portion in which the metal particles are embedded. However, there is a need to have a plurality of superimposed structured polarizing substrates in order to obtain a structured polarizer having portions with different polarization directions because each substrate only provides one polarization direction. This approach therefore results in limited spatial resolution of adjacent portions with different polarization direction as the substrates are stacked on each other. Furthermore, the manufacturing costs are rather high due to the necessity of many stacked substrates.

DE 100 64 456 B4 discloses a spatially structured polarizing device as shown in FIG. 1 in which a plurality of portions 11, 12, 13, 14 having a different polarization direction are arranged side by side to each other within one layer. The boundaries between adjoining polarizing regions 11, 12, 13, 14 are depicted by reference sign 15. In order to obtain portions with different polarization direction, a pulsed laser beam with different polarization direction is irradiating onto the different portions causing the embedded metal particles to elongate and align along the beams' polarization direction. However, due to the Gaussian beam intensity profile 41 as shown in FIG. 2, the resulting non-linear response 42 of deformation with respect to laser intensity, the degree of particle deformation 43 is non uniform, i.e. a central region of each portion 11, 12, 13, 14 exhibits a higher polarization contrast compared to a peripheral region. This leads to blurred transition zones 44 along the boundaries between adjoining polarizing regions resulting either in regions 45 of insufficient or incorrect polarization (FIG. 1A) or in regions 46 of undefined or overlapping polarization. This however, significantly limits the spatial resolution of the structured polarizing device.

It is therefore an object of the present invention to provide a structured polarizer and a method for manufacturing the same which overcome the mentioned deficiencies in the prior art.

SUMMARY OF THE INVENTION

According to an aspect of the present invention, a structured polarizer is disclosed, comprising a substrate being formed of a dielectric material in which elongated metal particles are embedded so as to form a polarizing layer, the polarizing layer comprising a plurality of first polarizing regions having first elongated metal particles being collectively aligned along a first (polarization) direction and a plurality of second regions having second metal particles, wherein the first polarizing regions and the second regions are arranged side by side such to adjoin each other, and wherein the first metal particles of the first polarizing regions are arranged in the same plane of the polarizing layer as the second metal particles of the second regions, and wherein a degree of polarization with respect to the first (polarization) direction in (all areas of) the first polarizing regions at a distance between 0.5 μm and 1 μm from a boundary between the first polarizing regions and the second regions is more than 90%, and a degree of polarization with respect to the first (polarization) direction in (all areas of) the second regions at a distance between 0.5 μm and 1 μm from the boundary between the first polarizing regions and the second regions is less than 10%. A preferred distance for the above-mentioned conditions is 0.75 μm.

The main idea of the present invention is to provide a structured polarizer in which a plurality of portions having a different polarization (or no prevailing) direction are arranged side by side to each other within one layer (plane) where a degree of polarization in close vicinity to the boundary between the said (polarizing) regions is more than 90% inside a respective region and less than 10% outside the respective region. The structured polarizer can advantageously achieve high spatial resolution due to the aforementioned properties. In other words, the profile of the degree of polarization along a region (also referred to as portion) does not have a shape of a Gaussian curve or the like but has a stepped or nearly stepped profile, the steps being in the boundary (portion) between the two said regions.

According to the present invention, a polarizing region is defined by a region having a uniform polarizing direction. A uniform polarizing direction is understood such that a direction of polarization differs from an average polarization direction by less than 5°, preferably by less than 2° and more preferably by less than 1° (full circle is) 360°.

According to the present invention, a non-polarizing region is defined by a region exhibiting no polarization and/or in which the majority of the nanoparticles are spheres or randomly oriented elongated nanoparticles. More preferably, a degree of polarization of a non-polarizing region is less than 5%, more preferably less than 2%, more preferably less than 1% and still more preferably less than 0.2%.

According to the present invention, a boundary between the two adjacent polarizing regions having different polarization directions is defined as a line extending between the two regions where a degree of polarization of a first (polarization) direction (which prevails in a first of the two adjacent polarizing regions) is equal to degree of polarization of a second (polarization) direction (which prevails in the second of the two adjacent polarizing regions). Said line defining the boundary preferably extends parallel to a surface of the substrate in which the metal particles are embedded. Preferably, the said line defining the boundary extends in a depth in which a density of the metal particles is a maximum.

According to the present invention, a boundary between a polarizing region and a non-polarizing region is defined as a line extending between the two regions where a degree of polarization of the polarization direction (which prevails in the polarizing region) is 50%.

According to the present invention, a degree of polarization at a designated location is the quotient of (Ts minus Tp) divided by (Ts plus Tp) where Ts is the optical transmittance value of linear polarized light of a certain wavelength (or range of) with a polarization along an intended polarization direction and Tp is the optical transmittance value of said linear polarized light of the same radiation (i.e. same wavelength or same range of) for a polarization direction being perpendicular to said intended polarization direction. Preferably, Ts and Tp are measured by subsequent transmittance measurement with a setup of a polarized light source and a sensor with the sample located between source and sensor. Ts is the quotient of the sensors value with the sample in-between sensor and light source where the polarization of the sample is aligned parallel to the polarization of the light source and the sensor value without any sample in-between sensor and light source. Tp is the same quotient but with the region's polarization oriented perpendicular to the polarization of the light source. The beam diameter shall be smaller than the regions' lateral dimensions. Preferably, the setup is an optical spectrometer. Preferably, the incident angle is 0 degree (perpendicular to the samples surface).

According to the present invention, a polarization contrast is the ratio between a transmitted portion of linear polarized light of a certain wavelength (or range of) with a polarization direction parallel to a polarization axis of a filter which is passed and a transmitted portion of linear polarized light of the same wavelength (or same range of) with its polarization direction perpendicular to the polarization axis of the filter which is passed.

A polarization axis of a polarizing filter is given by an angle of polarization of incident linear polarized light of a certain wavelength (or range of) that is transmitted most compared to all other angles.

Preferably a degree of polarization with respect to the first (polarization) direction in (all areas of) the first polarizing regions at a distance between 0.5 µm and 1 µm from a boundary between the first polarizing regions and the second regions is more than 99%, and a degree of polarization with respect to the first (polarization) direction in (all areas of) the second regions at a distance between 0.5 µm and 1 µm from the boundary between the first polarizing regions and the second regions is less than 1%. A preferred distance for the above-mentioned conditions is 0.75 µm.

Preferably the second regions are formed as second polarizing regions having second elongated metal particles being collectively aligned along a second (polarization) direction being different from the first (polarization) direction, or wherein the second regions are formed as non polarizing regions.

Preferably more than 50%, more preferably more than 90% of all metal particles have a (maximum) size ranging between 100 and 2000 nm, more preferably between 200 and 1500 nm and still more preferably between 400 and 800 nm. Preferably the dielectric material is formed of glass or plastics.

Preferably the metal particles are selected from a group consisting of Ag, Cu, Al, Au, Pt, alloys thereof or core shell structures thereof.

Preferably the substrate comprises a planar upper surface.

Preferably more than 50%, more preferably more than 90% of all metal particles are embedded within the substrate in a depth between 1 µm and 100 µm, more preferably between 5 µm and 20 µm.

Preferably a layer thickness (vertical extension with respect to an upper surface of the substrate) of the layer in which the metal particles are enclosed ranges between 1 µm and 100 µm, more preferably between 5 µm and 20 µm.

Preferably a maximum lateral dimension of each of the regions is less than 20 µm, more preferably less than 15 µm, more preferably less than 10 µm and still more preferably less than 8 µm.

Preferably a degree of polarization with respect to the second (polarization) direction in (all areas of) the second polarizing regions at a distance between 0.5 µm and 1 µm from a boundary between the first polarizing regions and the second polarizing regions is more than 90%, more preferably more than 99%. A preferred distance for the above-mentioned conditions is 0.75 µm.

Preferably a degree of polarization with respect to the second (polarization) direction in (all areas of) the first polarizing regions at a distance of between 0.5 µm and 1 µm from a boundary between the first polarizing regions and the second polarizing regions is less than 10%, more preferably less than 1%. A preferred distance for the above-mentioned conditions is 0.75 µm.

Preferably the plurality of first polarizing regions and second polarizing regions are arranged within a single layer. The single layer is embedded within the substrate.

Preferably the polarizing layer has a uniform thickness.

Preferably the structured polarizer further comprises a plurality of third polarizing regions having third elongated metal particles being collectively aligned along a third (polarization) direction and a plurality of fourth polarizing regions having fourth elongated metal particles being collectively aligned along a fourth (polarization) direction, each of the first (polarization) direction, the second (polarization) direction, the third (polarization) direction and fourth (polarization) direction being different from one another, wherein the first polarizing regions, the second polarizing regions, the third polarizing regions and the fourth polarizing regions are arranged in a matrix.

Preferably the first (polarization) direction and the second (polarization) direction differ by 45° (full circle is 360°). Preferably the third (polarization) direction and the fourth (polarization) direction differ by 45°. Preferably the first (polarization) direction and the fourth (polarization) direction differ by 90°. Preferably the second (polarization) direction and the third (polarization) direction differ by 90°.

According to the invention, the collectively aligned particles of a polarizing region may be aligned along the same direction as the polarization direction. However, alternatively, the collectively aligned particles of a polarizing region may be aligned along a direction extending perpendicular to the polarization direction or along any other direction depending on the shape of the aligned particles.

Preferably the substrate has a rectangular shape. A polarization direction is preferably measured with respect to a (longest) edge of the substrate.

Preferably the first polarizing regions and the second polarizing regions as well as the third polarizing regions and the fourth polarizing regions are alternatingly arranged along a row direction.

Preferably the first polarizing regions and the third polarizing regions as well as the second polarizing regions and the fourth polarizing regions are alternatingly arranged along a column direction, wherein each of the first polarizing regions, the second polarizing regions, the third polarizing regions and the fourth polarizing regions has a uniform size.

Preferably each of the first polarizing regions, the second polarizing regions, the third polarizing regions and the fourth polarizing regions has a rectangular shape.

Preferably the metal particles are ellipsoidal nanoparticles. Preferably a ratio of length and width of the metal particles which are arranged in polarizing regions ranges between 3000 and 2, more preferably between 500 and 5 and still more preferably between 200 and 5.

Preferably a ratio of length and width of the metal particles which are arranged in non-polarizing regions ranges between 2 and 0.5, more preferably between 1.5 and 0.7 and still more preferably between 1.1 and 0.9.

According to an aspect of the present invention, at least 90% (preferably 99%) of the metal particles in (all areas of) the first polarizing regions (which exhibits a first (polarization) direction as a prevailing polarization direction) at a distance between 0.5 μm and 1 μm from a boundary between the first polarizing regions and the second regions are aligned such that an angle between the longitudinal axis of the metal particles and of the first (polarization) direction is less than 5°, more preferably less than 2° and still more preferably less than 1°.

Preferably less than 10%, more preferably less than 1% of the metal particles in (all areas of) the second polarizing regions at a distance between 0.5 μm and 1 μm from a boundary between the first polarizing regions and the second regions are aligned such that an angle between the longitudinal axis of the metal particles and of the first (polarization) direction is less than 5°, more preferably less than 2° and still more preferably less than 1°.

According to an aspect of the present invention, a method for manufacturing a structured polarizer according to present invention is disclosed, the method comprising: providing a substrate of a dielectric material in which (preferably spherical) metal particles are embedded, arranging a mask having a plurality of openings or a diffractive optical element in front of the substrate, and irradiating the substrate with polarized light through the openings of the mask or through the diffractive optical element such to align (at least) part of the metal particles according to a polarization direction of the light or a direction extending perpendicular to the polarization direction.

The main idea is that using a mask or a diffractive optical element, a high intensity contrast of the polarized laser radiation can be achieved along edges of the openings of the mask thereby resulting in a high contrast of the degree of polarization along a boundary of different regions.

Preferably, the mask is arranged such that a distance between the mask and (an upper surface of) the substrate is less than 1 mm, more preferably less than 0.1 mm. Preferably, the mask is arranged such to directly contact the substrate. The closer the mask, the higher is the contrast of the degree of polarization along a boundary of different regions.

The openings in the mask correspond to the first, second (third and fourth regions, if applicable) regions of the structured polarizer in terms of size and shape. In other words, the openings in the mask have the same size/shape as the respective regions.

That is, preferably the openings each have a rectangular shape. Preferably all openings of the mask have a rectangular shape. Preferably the openings of the mask are arranged such to form a uniform pattern. More preferably, the openings of the mask are arranged in rows and columns, wherein a distance between adjacent openings of a row is equal to row-wise extension of the openings and/or a distance between adjacent openings of a column is equal to column-wise extension of the openings.

Preferably polarized pulsed laser radiation is used for irradiating the substrate. Preferably the wavelength of the laser radiation ranges between 340 nm and 3000 nm. Preferably the pulse duration of the laser radiation ranges between 100 fs and 5 ps. Preferably the repetition rate of the laser radiation ranges between 100 Hz and 1 MHz.

Preferably a diameter of the laser beam is greater than the diameter (or maximum lateral extension) of the openings. Preferably the laser beam intensity profile is adapted such and the laser beam is irradiated onto the openings such that a homogenous application of energy across the surface (cross section of the opening) is achieved. Preferably this is accomplished by over scanning, preferably the scanning grid is smaller than the beam diameter.

Preferably, the laser beam is spatially fixed (i.e. its location and radiation direction do not change with the time during exposure) and the substrate as well as the mask/the diffractive optical element are moved together such to form a plurality of polarizing regions by alignment of metal particles according to a polarization direction of the light.

Alternatively, the laser beam is moved in relation to the substrate as well as to mask/the diffractive optical element for forming a plurality of polarizing regions.

Still alternatively, the substrate and the mask are spatially fixed (i.e. their location does not change with the time during exposure) and the beam is scanned over the mask to form a plurality of polarizing regions by alignment of metal particles according to a polarization direction of the light.

Preferably, a ratio of an intensity of the light beam in a central region of an opening and an intensity of the light beam in a peripheral region the opening ranges between 0.1 and 10, more preferably between 0.5 and 2 and still more preferably between 0.8 and 1.25.

According to another aspect of the present invention, a method for manufacturing a structured polarizer according to present invention is disclosed, the method comprising: providing a substrate of a dielectric material in which metal particles are embedded, forming a polarized light beam having a rectangular beam profile such that a ratio of an intensity of the light beam in a central region of its cross section and an intensity of the light beam in a peripheral region of its cross section ranges between 0.2 and 5, discontinuously irradiating the polarized light beam onto the substrate such to align part of the metal particles according to a polarization direction of the light or a direction extending perpendicular to the polarization direction.

More preferably, a ratio of an intensity of the light beam in a central region of its cross section and an intensity of the light beam in a peripheral region of its cross section ranges between 0.8 and 1.25 and still more preferably between 0.95 and 1.05.

The main idea is that a rectangular beam profile is formed with highly uniform radiation intensity over its rectangular profile. This beam is then used to treat metal particles such to achieve a high contrast of the degree of polarization along a boundary of different regions. Such beam profile can preferably be created by diffractive 'flat-top' beam shapers with or without a passe-partout or by just a passe-partout with a sufficiently large beam diameter compared to the passe-partout's opening.

Preferably the polarized light beam is scanned over the substrate.

Preferably the substrate is moved in relation to the polarized light beam which is fixedly arranged.

The methods specified above are used for manufacturing a structured polarizer with at least one feature specified in the application.

BRIEF DESCRIPTION OF THE DRAWINGS

In the following the invention will be described in further detail. The examples given are adapted to describe the invention, but not to limit the invention in any case.

DETAILED DESCRIPTION OF THE DRAWINGS

Figure 1A:
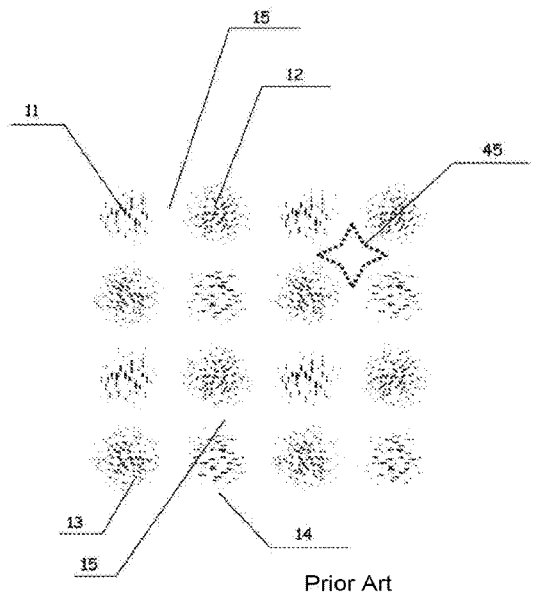
FIG. 1A shows a conventional structured polarizing device having regions of insufficient polarization.
Figure 1B:
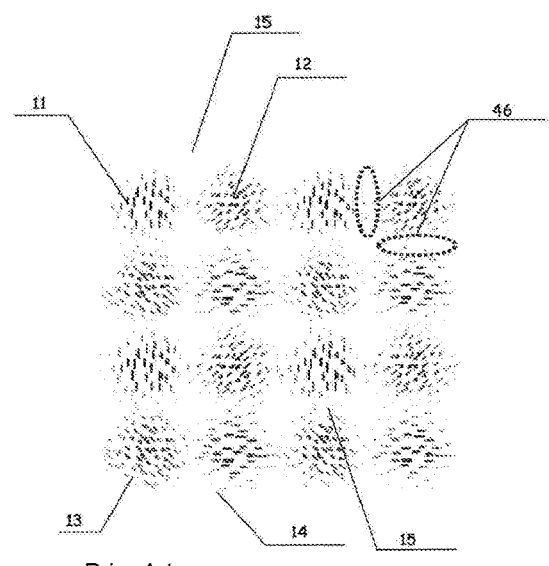
FIG. 1B shows a conventional structured polarizing device having regions of undefined polarization.
Figure 2:
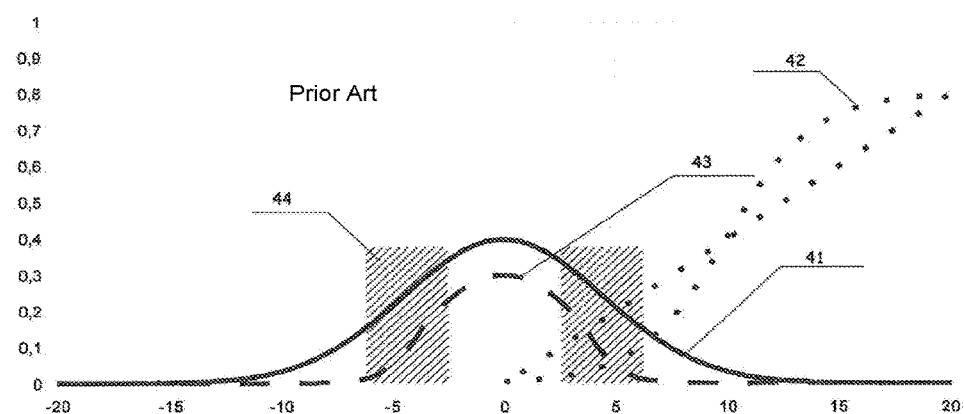
FIG. 2 shows the non-linear response of deformation of metal particles being treated with polarized laser radiation with respect to laser the intensity.
Figure 3:
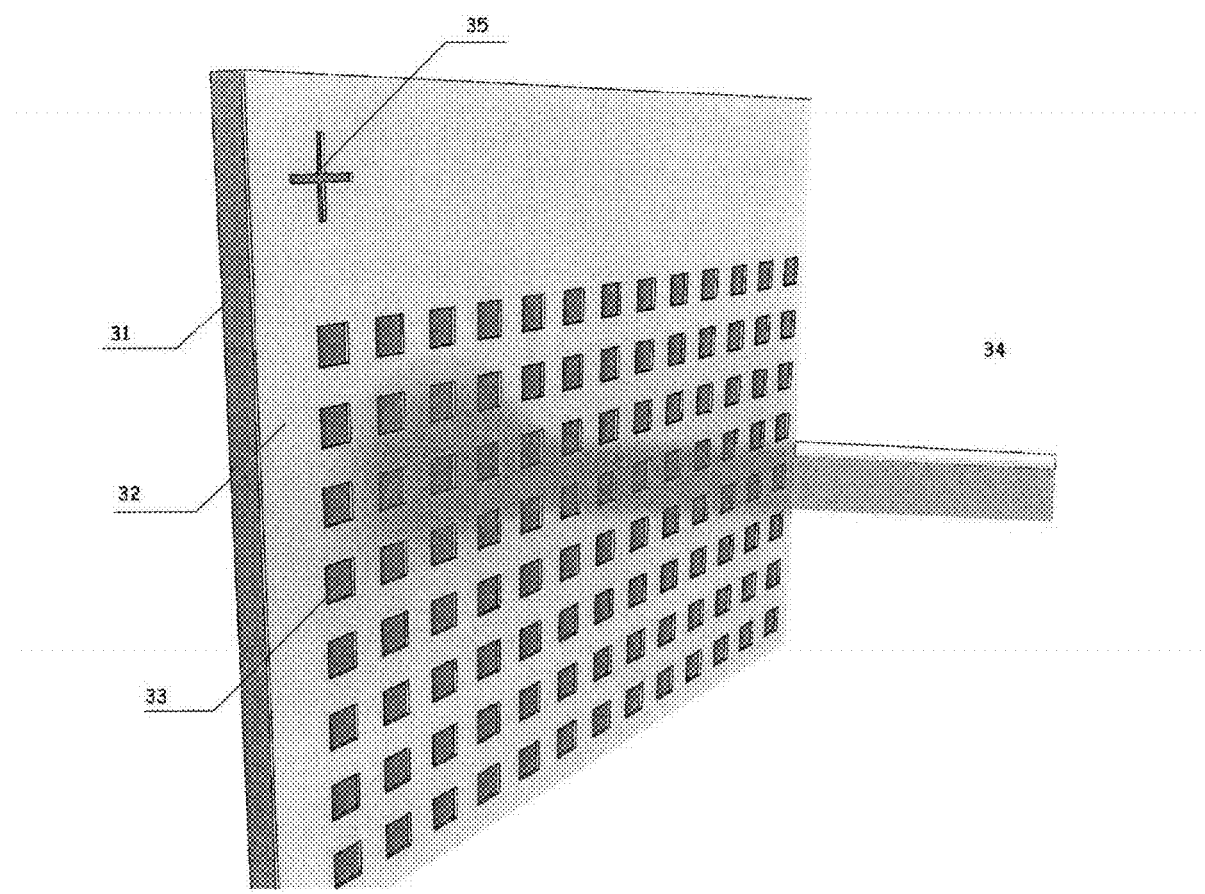
FIG. 3 shows a mask used for manufacturing a structured polarizer according to the present invention.
Figure 4:
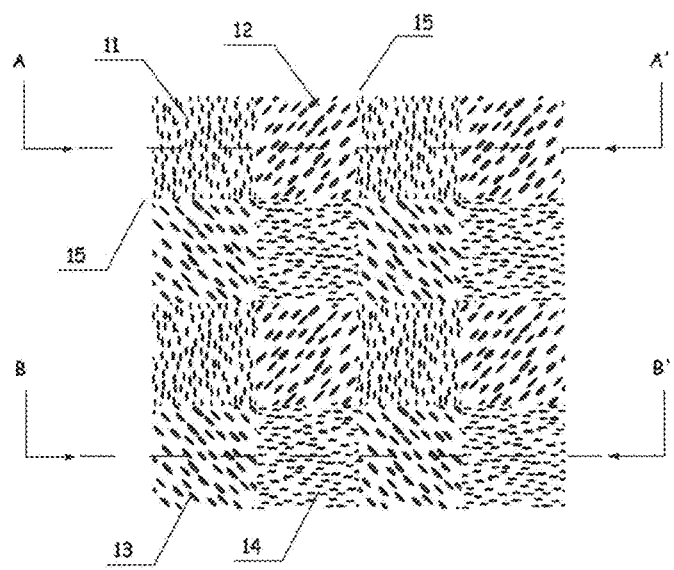
FIG. 4 shows a schematic top view of a structured polarizer according to an embodiment of the present invention.
Figure 5:
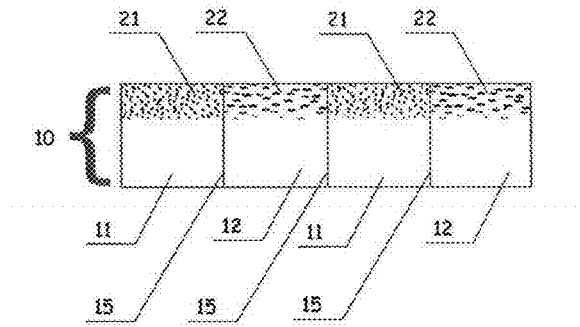
FIG. 5 shows a sectional schematic view of the structured polarizer of FIG. 4 along cutting line AA'.
Figure 6:
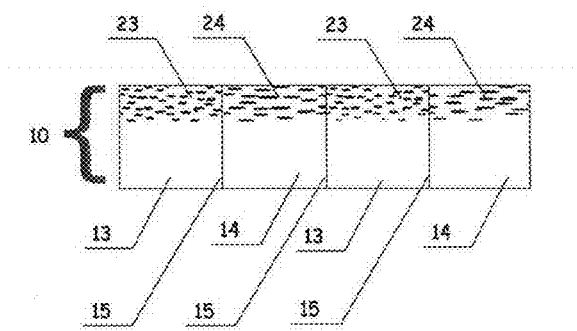
FIG. 6 shows a sectional schematic view of the structured polarizer of FIG. 4 along cutting line BB'.

FIG. 4 shows a plane schematic view of a structured polarizer according to an embodiment of the present invention while FIGS. 5 and 6 show a sectional schematic view of this along cutting line AA' and cutting line BB', respectively.

The structured polarizer in this preferred embodiment comprises a plurality of first polarizing regions 11, second polarizing regions 12, third polarizing regions 13 and fourth polarizing regions 14 which are arranged in a uniform pattern in an upper region of the dielectric substrate 10. The first polarizing region 11 has a first polarization direction for (non-polarized) incident light (which is preferably irradiated perpendicularly onto the substrate 10) which extends along a direction being perpendicular to axis of cutting line AA' which is herewith defined to be 0°. The second polarizing region 12 has a second polarization direction for which extends along an axis of 45°. The third polarizing region 13 has a third polarization direction for which extends along an axis of 135°. The fourth polarizing region 14 has a fourth polarization direction for which extends along an axis of 90°.

Each of the first polarizing regions 11, the second polarizing regions 12, the third polarizing regions 13 and the fourth polarizing regions 14 has a quadratic cross-section (FIG. 4) with edge size of 10 μm. However, the invention is not limited thereto, for example, the edge size can be 7 μm or smaller. Each of the first polarizing regions 11, the second polarizing regions 12, the third polarizing regions 13 and the fourth polarizing regions 14 is repeatedly arranged along columns and rows such first polarizing regions 11 and second polarizing regions 12 as well as third polarizing regions 13 and fourth polarizing regions 14 are alternatingly repeating along rows and that first polarizing regions 11 and third polarizing regions 12 as well as second polarizing regions 12 and fourth polarizing regions 14 are alternatingly repeating along columns. Adjacent polarizing regions 11, 12, 13 and 14 directly adjoin to each other. According to the invention, it is also possible to utilize patterns with other polarization directions as well as to utilize patterns having one or more non-polarizing region(s) combined with at least one polarizing region. Each pair of adjoining polarizing regions 11, 12, 13 and 14 has a boundary 15 in-between which preferably extends along a straight line. Each of the polarizing regions 11, 12, 13 and 14 comprises elongated (non-spherical) metal particles 21, 22, 23, 24 from which the polarization properties of each region 11, 12, 13 and 14 stem. Depending on the size and distribution of the metal particles 21, 22, 23, 24 (colloids), a longitudinal axis of the elongated particles 21, 22, 23, 24 may coincide with the respective polarization direction or a direction perpendicular to the respective polarization direction. However, the present invention is not limited thereto. Preferably, the metal particles 21, 22, 23, 24 (which can also be formed as colloids) are embedded to be spaced apart from one another within the dielectric substrate 10 in an upper portion. The thickness of the portion in which (preferably more than 99% of the) metal particles 21, 22, 23, 24 are arranged within the substrate 10 ranges between 5 and 20 μm.

According to the present invention, adjacent regions 11, 12, 13 and 14 exhibit a high contrast in the boundary portions 15 such to avoid blurred transition zones or regions of insufficient or incorrect polarization in peripheral areas (intersection of boundary lines 15 along rows with boundary lines 15 along columns).

Figure 7:
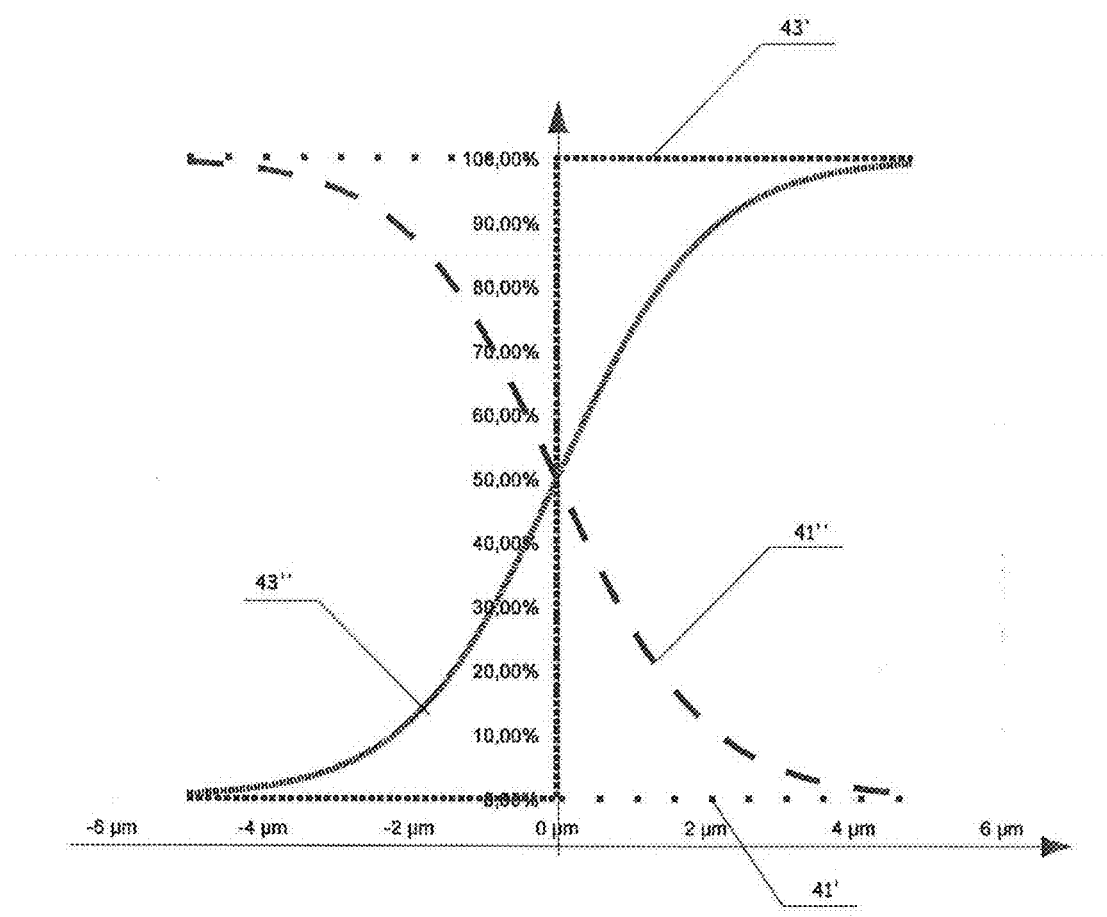
FIG. 7 shows a comparison between a degree of polarization of the structured polarizer of FIG. 4 and a conventional structured polarizer in the vicinity of a boundary between adjacent regions.

FIG. 7 shows a comparison between a degree of polarization of the structured polarizer of FIG. 4 along cutting line AA' and a conventional structured polarizer in the vicinity of a boundary 15 between adjacent regions 11 and 12. As can be seen from FIG. 7, conventional laser beams used for deforming the metal particles have a Gaussian beam profile 41" that has a low contrast at a region close to the boundary 15 which is located at 0 μm in FIG. 7. The first polarizing region 11 extends from the boundary 15 to the left side of FIG. 7, i.e. for negative value along the horizontal axis while the second polarizing region 12 extends from the boundary 15 to the right side. In a conventional structured polarizer, however, a low contrast of the intensity of the Gaussian beam profile 41" (i.e. a low ratio between the intensity at a distance between −0.5 μm and −1 μm and the intensity at a distance between 0.5 μm and 1 μm) results in a low contrast particle deformation 43" (i.e. a low ratio between the particle deformation at a distance between −0.5 μm and −1 μm and the particle deformation at a distance between 0.5 μm and 1 μm) and thus in a low contrast of the polarization degree with respect to the first polarization direction. According to the present invention, a high polarization contrast with respect to the first polarization direction is provided in the vicinity of the boundary 15, for example, due to use of a mask 32 having openings 33 that sharply increase the intensity contrast at the boundary 15 or the use of diffractive 'flat-top' beam shapers amongst others. A high contrast of the intensity of the Gaussian beam profile 41' (i.e. a high ratio between the intensity at a distance between −0.5 µm and −1 µm and the intensity at a distance between 0.5 µm and 1 µm) results in a high contrast particle deformation 43' (i.e. a low ratio between the particle deformation at a distance between −0.5 µm and −1 µm and the particle deformation at a distance between 0.5 µm and 1 µm) and thus in a high contrast of the polarization degree with respect to the first polarization direction.

In other words, the present invention provides a high polarization contrast in the vicinity of the boundary 15 such that a degree of polarization with respect to the first direction in the first polarizing regions 11 at a distance between 0.5 µm and 1 µm from a boundary 15 between the first polarizing regions 11 and the second regions 12 is more than 90% while a degree of polarization with respect to the first direction in the second regions 12 at a distance between 0.5 µm and 1 µm from the boundary 15 between the first polarizing regions 11 and the second regions 12 is less than 10%. The same applies for the second polarization direction mutatis mutandis, i.e. the present invention provides a high polarization contrast in the vicinity of the boundary 15 such that a degree of polarization with respect to the second direction in the second polarizing regions 12 at a distance between 0.5 µm and 1 µm from a boundary 15 between the first polarizing regions 11 and the second regions 12 is more than 90% while a degree of polarization with respect to the second direction in the first regions 12 at a distance between 0.5 µm and 1 µm from the boundary 15 between the first polarizing regions 11 and the second regions 12 is less than 10%.

The pattern of size and locations of the openings 33 in the metal mask 32 preferably corresponds to the (are the same as) pattern of the first regions 11. That is, a distance between adjacent openings 33 along rows and columns is equal to a respective extension of the openings 33 along rows and columns. Then, the same mask 33 can be repeatedly used for different regions 11-14 (i.e. different polarization directions) in subsequent process steps (i.e. using differently polarized light) when shifting the mask 32 by a distance of the size of the opening either along the row or the column.

In the following a method for manufacturing a structured polarizer according to a first preferred embodiment of the present invention is disclosed in connection with FIG. 8.

With the following steps, the aforementioned patterned polarizer is achieved:

In a first step, a nanoparticle creation process is applied to a sample of soda lime float glass (common window glass). In other words, particles (one of 21, 22, 23, 24) are provided to be embedded within the substrate 10. This can be achieved by a process for example known from Martin Mennig "Zur Verformung sphärischer Silberkolloide durch plastische Deformation des sie umgebenden Glases", Dissertation zur Erlangung des Doktorgrades (Dr. rer. nat.) as well as Klaus-Dieter Schicke "Untersuchungen zur Bildung von Silbernanopartikeln in Natronkalk-Silikatglasern durch Ionenaustausch", Dissertation zur Erlangung des akademischen Grades doctor rerum naturalium (Dr. rer. nat.).

As an optional second step, when the opposite surface of the substrate 10 contains nanoparticles as well and these nanoparticles shall not be used, said particles may be removed by single side grinding and polishing.

As a third step (step "metallization" in FIG. 8) an aluminium layer of about 200 nm is coated onto the surface that contains the nanoparticles by using PVD for creating a metal mask 32.

A fourth step ("structuring of metal mask" in FIG. 8) is applying a common photo lithography process to create the square openings within the aluminium layer, i.e. applying photoresist layer with spin coating, exposure the photoresist through a master mask with the square openings of 10 µm×10 µm, repeated every 20 µm in each lateral the x- and the y-direction, i.e. along rows and columns where rows and columns are parallel to the main edges of the mask, respectively, develop the photoresist to create the openings 33 within the photoresist layer, selectively etch the aluminum layer underneath to transfer the openings from the photoresist to the aluminium layer and finally remove the remaining photoresist. In this case, the mask (structured aluminium layer) 32 is directly contacting the substrate 10, 31.

Figure 8:
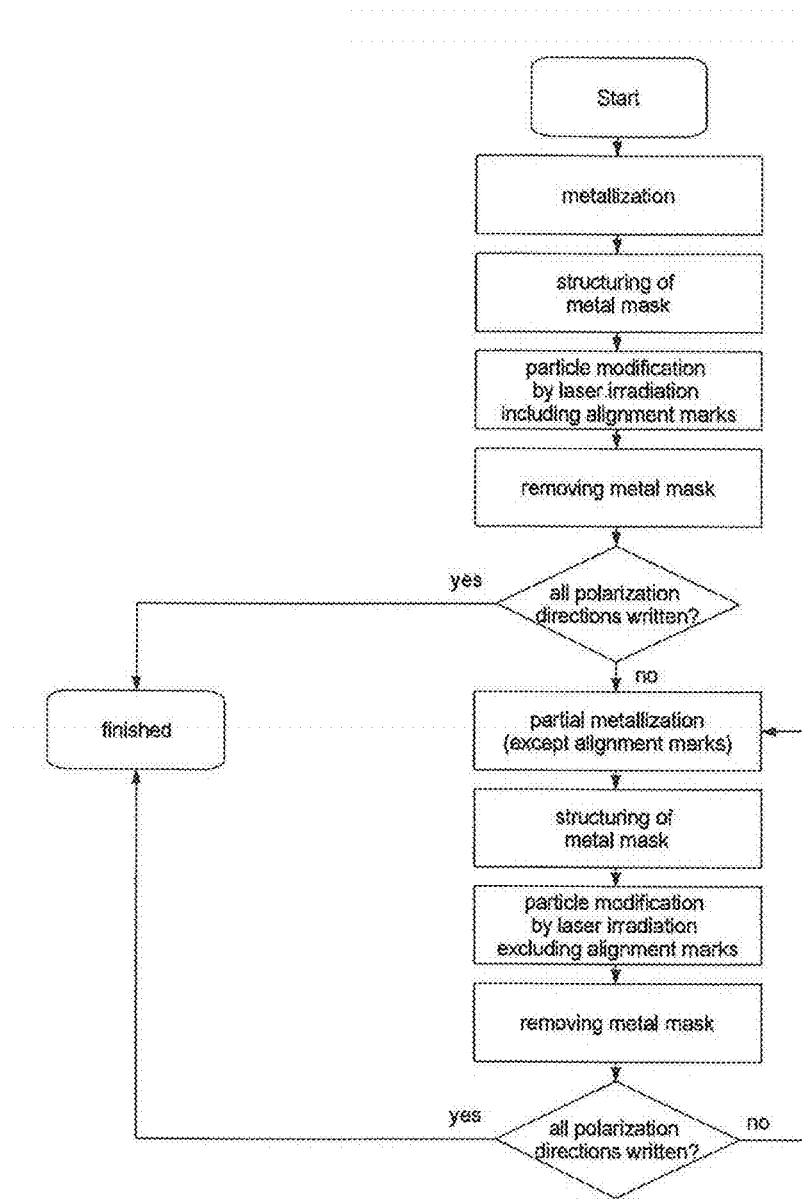
FIG. 8 shows a flowchart of the method for manufacturing a structured polarizer according to an embodiment of the present invention.

A fifth step ("particle modification by laser radiation including alignment marks" in FIG. 8) is the irradiation with ultra short pulsed laser light which is e.g. specified in DE 198 23 257 B4. The laser is redirected by scanning mirrors of a laser scanner through an f-theta lens that shapes a beam spot diameter of about 20 µm at the samples' surface. The other parameters of the laser are chosen such that the required polarization characteristics are achieved when irradiated 400 times. The laser beam spot 34 is then continuously redirected such that the whole surface of the mask 32 is exposed to the laser over the time. The scanning speed and the repetition rate is such that two spots created by two subsequent laser pulses are redirected overlapping by 10 µm. Preferably, the scanning pattern is like writing row-lines from left to right, starting with the first line at the upper left corner to the upper right corner, then displacing the second line by 0.1 µm towards the bottom of the sample, repeat the left-to-right line-scan, displacing by another 0.1 µm and so on. The line-scans are repeated until the last line reaches the bottom of the sample. Thus, each place within the sample is irradiated 400 times. The energy density applied onto the sample is substantially the same over the whole surface. But all regions covered by aluminium are left unchanged, while all particles in uncovered exposed regions are modified to exhibit polarization properties. A precise alignment can easily be done by using the alignment mark 35 which is located in the mask 32 outside an area which is occupied by the regular pattern of the openings 32.

A sixth step is completely removing the aluminium layer ("removing metal mask" in FIG. 8).

It is then checked ("all polarization directions written?" in FIG. 8) whether all polarization directions have already been manufactured. If yes, for example when using a structured polarizer having polarization regions with one polarization direction and polarization regions without polarization, the process is finished. However, in case four different polarization regions 11, 12, 13, 14 with four different polarization directions are to be manufactured, said steps 3 to 6 are repeated while the openings 32 of the mask 33 are shifted by 10 µm along row direction for the second regions 12, by 10 µm along column direction for the third regions 13 and (starting from the first regions 11) by 10 µm along a row direction and by 10 µm along a column direction for the fourth regions 14.

In detail, for manufacturing another polarization direction rotated by 45° the following steps are carried out.

A seventh step is same as the third step, but some part of the surface is left uncoated such that some areas of the modified regions are not covered by aluminium layer. This can be done by covering these areas with a mask during the coating process.

An eighth step is same as the fourth step, but the master mask 32 is now aligned in respect to polarizing structures created in step five that are partially left uncovered with aluminium in step seven and can be seen when aligning the mask before exposure. The alignment is done such that the openings are shifted in lateral x-direction by 10 μm thereby exactly neighboring the polarizing regions created in step five.

Step nine is same as step five, but the polarization of the irradiating laser is now rotated by 45° and the for alignment purposes uncovered areas are not irradiated by blanking the laser pulses while scanning over these areas.

The tenth step is same as the sixth step.

Steps seven to ten are repeated two further times (for 90° and 135°), whereas the mask 32 is shifted in the first repetition of step eight in lateral y-direction by 10 μm and for the second repetition of the eight step the mask is shifted in lateral x-direction by −10 μm.

In the following a method for manufacturing a structured polarizer according to a second preferred embodiment of the present invention is disclosed. With the following steps, the aforementioned patterned polarizer is achieved:

In a first step, a nanoparticle creation process is applied to a sample of soda lime float glass (common window glass).

As an optional second step, when the opposite surface contains nanoparticles as well and these second surfaces nanoparticles shall not be used, said particles may be removed by single side grinding and polishing.

The sample is fixed onto a x-y-table. An ultra short pulse laser is collimated or focused onto the sample. The typical Gaussian shaped beam intensity profile is modified by a fixed thin metal plate with square opening of 10 μm. This plate is installed directly parallel to and in front of the sample. The distance between the fixed plate and the sample is less than 10 μm. When the sample is moved along the x-y-table, the plate remains fixed in the same position. At the beginning, the sample is positioned with the x-y-table to an initial starting position such that the upper left corner can be irradiated by the laser light passing the metal plate.

In a third step, the position underneath the opening of the mask is irradiated by ultra shot pulse laser light. The intensity, frequency and pulse length are chosen such that the intended polarization characteristics are achieved. The amount of pulses necessary onto that position is applied. When the modification is finished (sufficient amount of pulses applied), laser irradiation is blanked.

In a fourth step, the sample is moved by 20 μm along a lateral x-direction.

Step three and step four are repeated until the right edge of the sample is reached. Now the sample is moved by 20 μm in lateral y-direction, and steps three and four are repeated until the left edge of the sample is reached. To reach the left edge, the movement in step four is now 20 μm in opposite lateral x-direction (x- and y-direction are perpendicular to each other). These repetitions are repeated until the bottom of the sample is reached.

In a fifth step, the sample is moved to the initial position with an offset in lateral x-direction of 10 μm and the polarization of the laser is rotated by 45°. Now steps three and four are repeated in the same manner as before until the bottom of the sample is reached.

In a sixth step, the sample is moved to the initial position with an offset in both, lateral x- and lateral y-direction of 10 μm and the polarization of the laser is rotated by 45° again.

Now steps three and four are repeated in the same manner as before until the bottom of the sample is reached.

In a seventh step, the sample is moved to the initial position with an offset lateral y-direction of 10 μm and the polarization of the laser is rotated by 45° again. Now steps three and four are repeated in the same manner as before until the bottom of the sample is reached.

LIST OF REFERENCE SIGNS 10 substrate/polarizing layer
11 first polarizing region
12 second polarizing region
13 third polarizing region
14 fourth polarizing region
15 boundary between adjoining polarizing regions
21 first metal particles
22 second metal particles
23 third metal particles
24 fourth metal particles
31 glass substrate containing nanoparticles
32 metal mask
33 region with removed metal layer/mask openings
34 laser beam
35 alignment mark
36 opening in metal mask
41 intensity profile of Gaussian shaped laser beam
42 non-linear response of deformation with respect to laser intensity
43 degree of particle deformation
44 blurred transition zone
45 region of insufficient polarization
46 region of undefined or overlapping polarization

What is claimed is:

1. A structured polarizer, comprising:
a substrate being formed of a dielectric material in which elongated metal particles are embedded such to form a polarizing layer, the polarizing layer comprising a plurality of first polarizing regions having first elongated metal particles being collectively aligned along a first direction and a plurality of second regions having second metal particles,
wherein the first polarizing regions and the second regions are arranged side by side such to adjoin each other,
wherein the first metal particles of the first polarizing regions are arranged in a common plane of the polarizing layer as the second metal particles of the second regions,
wherein a degree of polarization with respect to the first direction in the first polarizing regions at a distance between 0.5 μm and 1 μm from a boundary between the first polarizing regions and the second regions is more than 90%, and
wherein a degree of polarization with respect to the first direction in the second regions at a distance between 0.5 μm and 1 μm from the boundary between the first polarizing regions and the second regions is less than 10%.

2. The structured polarizer according to claim 1,
wherein the second regions are formed as second polarizing regions having second elongated metal particles being collectively aligned along a second direction being different from the first direction, or
wherein the second regions are formed as non polarizing regions.

3. The structured polarizer according to claim 1,
wherein a maximum lateral dimension of each of the first and second regions is less than 20 μm.

4. The structured polarizer according to claim 1,
wherein the second regions are formed as second polarizing regions having second elongated metal particles being collectively aligned along a second direction being different from the first direction,
wherein a degree of polarization with respect to the second direction in the second polarizing regions at a distance between 0.5 µm and 1 µm from a boundary between the first polarizing regions and the second polarizing regions is more than 90%, and
wherein a degree of polarization with respect to the second direction in the first polarizing regions at a distance of between 0.5 µm and 1 µm from a boundary between the first polarizing regions and the second polarizing regions is less than 10%.

5. The structured polarizer according to claim 1,
wherein the second regions are formed as second polarizing regions having second elongated metal particles being collectively aligned along a second direction being different from the first direction, and
wherein the plurality of first polarizing regions and second polarizing regions are arranged within a single layer.

6. The structured polarizer according to claim 1,
wherein the polarizing layer has a uniform thickness and the metal particles are formed within a distance of 1 to 50 µm from a surface of the polarizing layer.

7. The structured polarizer according to claim 1,
wherein the second regions are formed as second polarizing regions having second elongated metal particles being collectively aligned along a second direction being different from the first direction,
further comprising a plurality of third polarizing regions having third elongated metal particles being collectively aligned along a third direction and a plurality of fourth regions having fourth elongated metal particles being collectively aligned along a fourth direction, each of the first direction, the second direction, the third direction and fourth direction being different from one another,
wherein the first polarizing regions, the second polarizing regions, the third polarizing regions and the fourth polarizing regions are arranged in a matrix.

8. The structured polarizer according to claim 7,
wherein the first polarizing regions and the second polarizing regions as well as the third polarizing regions and the fourth polarizing regions are alternatingly arranged along a row direction;
wherein the first polarizing regions and the third polarizing regions as well as the second polarizing regions and the fourth polarizing regions are alternatingly arranged along a column direction; and
wherein each of the first polarizing regions, the second polarizing regions, the third polarizing regions and the fourth polarizing regions has a uniform size.

9. The structured polarizer according to claim 1, wherein the metal particles are spheroidal nanoparticles.

10. A method for manufacturing a structured polarizer according to claim 1, comprising:
providing a substrate comprising a dielectric material in which metal particles are embedded,
arranging a mask having a plurality of openings in front of the substrate, and
irradiating the substrate with polarized light through the openings of the mask such to align part of the metal particles according to a common direction.

11. The method of claim 10, wherein the mask is arranged such that a distance between the mask and the substrate is less than 1 mm.

12. The method according to claim 10, wherein the openings of the mask have a rectangular shape.

13. The method according to claim 10, wherein pulsed laser radiation is used for irradiating the substrate.

14. A method for manufacturing a structured polarizer according to claim 1, comprising:
providing a substrate comprising a dielectric material in which metal particles are embedded,
forming a polarized light beam having a rectangular beam profile such that a ratio of an intensity of the light beam in a central region of its cross section and an intensity of the light beam in a peripheral region of its cross section ranges between 0.2 and 5,
discontinuously irradiating the polarized light beam onto the substrate such to align part of the metal particles according to a common direction.

15. The method of claim 14, wherein the polarized light beam is scanned over the substrate and/or or the substrate is moved in relation to the polarized light beam.

16. The method according to claim 10, wherein the openings of the mask are arranged such to form a uniform pattern.

17. The method according to claim 11, wherein the openings of the mask are arranged such to form a uniform pattern.

* * * * *